United States Patent
Choung et al.

(10) Patent No.: US 7,956,393 B2
(45) Date of Patent: Jun. 7, 2011

(54) COMPOSITION FOR PHOTORESIST STRIPPER AND METHOD OF FABRICATING THIN FILM TRANSISTOR ARRAY SUBSTRATE

(75) Inventors: Jong-Hyun Choung, Hwaseong-si (KR); Bong-Kyun Kim, Incheon (KR); Hong-Sick Park, Suwon-si (KR); Sun-Young Hong, Yongin-si (KR); Young-Joo Choi, Jeollanam-do (KR); Byeong-Jin Lee, Seoul (KR); Nam-Seok Suh, Yongin-si (KR); Byung-Uk Kim, Hwaseong-si (KR); Suk-Il Yoon, Hwaseong-si (KR); Jong-Hyun Jeong, Hwaseong-si (KR); Sung-Gun Shin, Hwaseong-si (KR); Soon-Beom Huh, Hwaseong-si (KR); Se-Hwan Jung, Hwaseong-si (KR); Doo-Young Jang, Hwaseong-si (KR); Sun-Joo Park, Hwaseong-si (KR); Oh-Hwan Kweon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/564,019

(22) Filed: Sep. 21, 2009

(65) Prior Publication Data
US 2010/0151610 A1  Jun. 17, 2010

(30) Foreign Application Priority Data

Dec. 17, 2008  (KR) .................. 10-2008-0128684

(51) Int. Cl.
*H01L 31/062*  (2006.01)
*H01L 31/113*  (2006.01)
(52) U.S. Cl. ..... 257/293; 257/59; 257/192; 257/E21.17; 257/E21.051; 257/E21.189; 257/E21.259; 257/E21.268; 257/E21.278; 257/E21.293; 257/E21.527
(58) Field of Classification Search .................. 257/59, 257/192, 213, 293, 347, 359, E21.17, 51, 257/189, 278, 259, 268, 527
See application file for complete search history.

(56) References Cited

U.S. PATENT DOCUMENTS

| | | | |
|---|---|---|---|
| 5,561,105 A * | 10/1996 | Honda | 510/178 |
| 6,274,296 B1 * | 8/2001 | Chu | 430/331 |
| 6,379,875 B2 * | 4/2002 | Chu | 430/329 |
| 6,916,772 B2 * | 7/2005 | Zhou et al. | 510/201 |
| 7,144,848 B2 * | 12/2006 | Zhou et al. | 510/175 |

\* cited by examiner

*Primary Examiner* — David Nhu
(74) *Attorney, Agent, or Firm* — Innovation Counsel LLP

(57) ABSTRACT

A composition for a photoresist stripper and a method of fabricating a thin film transistor array substrate are provided according to one or more embodiments. In one or more embodiments, the composition includes about 5-30 weight % of a chain amine compound, about 0.5-10 weight % of a cyclic amine compound, about 10-80 weight % of a glycol ether compound, about 5-30 weight % of distilled water, and about 0.1-5 weight % of a corrosion inhibitor.

7 Claims, 6 Drawing Sheets

US 7,956,393 B2

COMPOSITION FOR PHOTORESIST STRIPPER AND METHOD OF FABRICATING THIN FILM TRANSISTOR ARRAY SUBSTRATE

CROSS-REFERENCE TO RELATED APPLICATION

This application claims priority and benefit from Korean Patent Application No. 10-2008-0128684 filed on Dec. 17, 2008 in the Korean Intellectual Property Office, the disclosure of which is incorporated herein by reference in its entirety.

BACKGROUND

1. Technical Field

Embodiments of the present invention generally relate to a composition for a photoresist stripper and a method of fabricating a thin film transistor (TFT) array substrate.

2. Description of the Related Art

Currently, liquid crystal displays (LCDs) are some of the most widely used flat panel displays. The LCD is provided with two substrates on which field-generating electrodes are formed, and a liquid crystal layer that is interposed between the substrates. In the LCD, a voltage is applied to the electrodes to rearrange the liquid crystal molecules of the LCD, thereby controlling the quantity of transmitted light.

An LCD that currently dominates the LCD market is of a type in which two substrates are provided with field-generating electrodes. In particular, a typically used type of LCD is provided with one substrate having a plurality of thin film transistors (TFTs) and pixel electrodes arranged in a matrix and another substrate having red, green and blue color filters formed thereon and a common electrode covering the entire surface of the substrate. However, in the LCD, the pixel electrodes and the color filters are formed on different substrates, so that misalignment may occur between the pixel electrodes and the color filters. To overcome this disadvantage, a color filter on array (CoA) type of LCD, which has a color filter and a pixel electrode formed on the same substrate, has been proposed.

In the CoA type of LCD, after forming the color filters, thin films such as pixel electrodes are formed. Here, the color filters are exposed to a photoresist stripper used for patterning thin films such as pixel electrodes. In general, a photoresist stripper made of an organic material has a high ability of melting a color filter. Accordingly, swelling may be caused to a portion of the color filter where it contacts the photoresist stripper. In such a case, the color filter may have an uneven surface, deteriorating adhesion between the color filter and another thin film overlying the color filter, which may cause the overlying thin film to get loosened or cracked. In addition, portions filled with liquid crystal varying in thickness by location may exist, resulting in deterioration of display quality. Therefore, it is desired to develop a stripper capable of stripping photoresist without causing damage to underlying films.

SUMMARY

Embodiments of the present invention provide a composition for a photoresist stripper which may prevent underlying films from being damaged when stripping photoresist.

Embodiments of the present invention also provide a method of fabricating a thin film transistor (TFT) array substrate using the composition for a photoresist stripper.

The above and other objects of the present disclosure will be described in or be apparent from the following description of one or more embodiments.

According to an embodiment of the present invention, there is provided a composition for a photoresist stripper including 5-30 weight % of a chain amine compound, 0.5-10 weight % of a cyclic amine compound, 10-80 weight % of a glycol ether compound, 5-30 weight % of distilled water, and 0.1-5 weight % of a corrosion inhibitor.

According to another embodiment of the present invention, there is provided a method of fabricating a thin film transistor array substrate, the method including forming a thin film transistor (TFT) including a gate electrode, a source electrode and a drain electrode on a pixel region of a substrate, forming a passivation layer on the TFT, and forming a pixel electrode connected to the drain electrode on the passivation layer, wherein when a photoresist pattern is used in each step, the photoresist pattern comprises 5-30 weight % of a chain amine compound, 0.5-10 weight % of a cyclic amine compound, 10-80 weight % of a glycol ether compound, 5-30 weight % of distilled water, and 0.1-5 weight % of a corrosion inhibitor.

BRIEF DESCRIPTION OF THE DRAWINGS

The above and other features and advantages of the present disclosure will become more apparent by describing in detail one or more embodiments thereof with reference to the attached drawings in which.

DETAILED DESCRIPTION

Figure 1A:
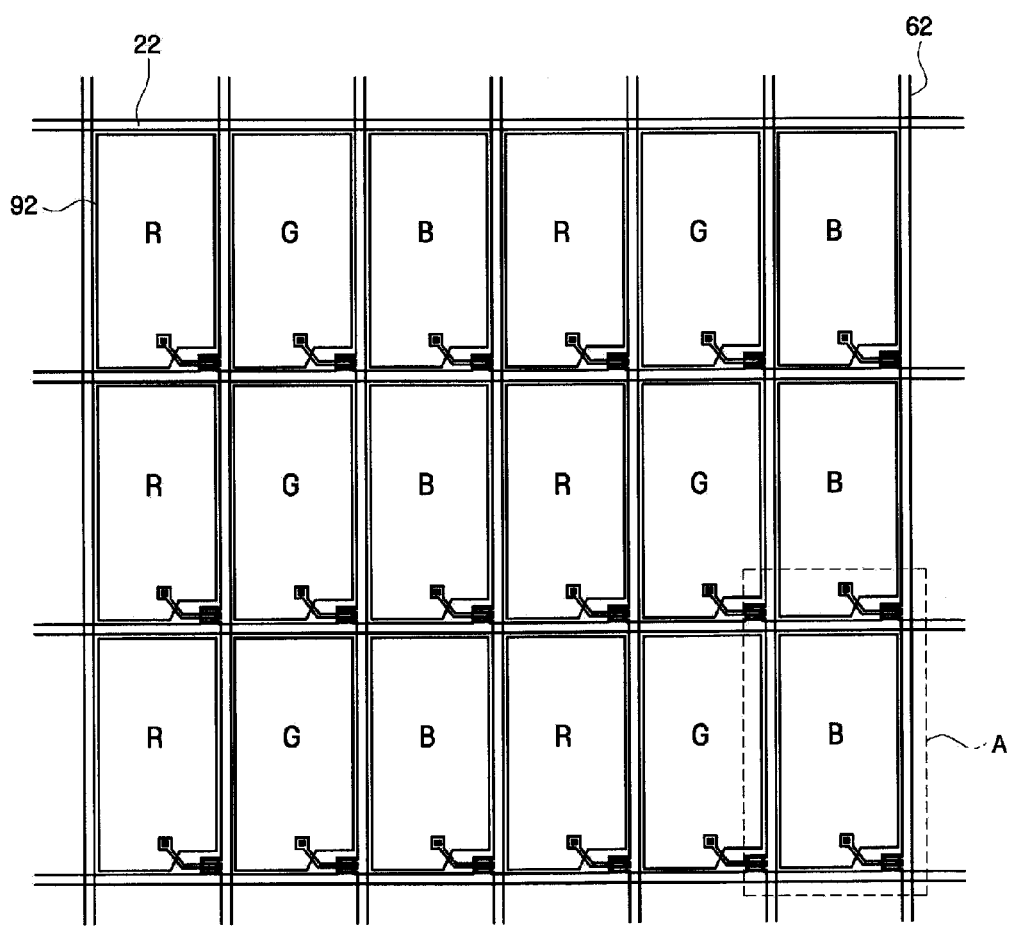
FIG. 1A is a layout view of a TFT array substrate according to an exemplary embodiment of the present invention.

Advantages and features of the present disclosure and methods of accomplishing the same may be understood more readily by reference to the following detailed description of one or more embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims. Like reference numerals refer to like elements throughout the specification. In the drawings, the thicknesses of layers and regions are exaggerated for clarity.

It will be understood that when an element or layer is referred to as being "on" another element or layer, it may be directly on the other element or layer, or intervening elements or layers may be present. In contrast, when an element is referred to as being "directly on" another element or layer, there are no intervening elements or layers present. As used herein, the term "and/or" includes any and all combinations of one or more of the associated listed items.

Spatially relative terms, such as "below," "beneath," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Exemplary embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing.

Hereinafter, compositions for a photoresist stripper according to embodiments of the present invention will be described in detail. In addition, methods of fabricating thin film transistor (TFT) array substrates using the compositions according to embodiments of the present invention will be described in detail with reference to the accompanying drawings.

Embodiments of the present invention relate to a composition for a photoresist stripper, which may minimize corrosion of organic films or metal wires. Here, the corrosion may be caused by a stripper used to remove a photoresist film in a photolithography process.

The composition according to one or more embodiments of the present invention comprises 5-30 weight % of a chain amine compound, 0.5-10 weight % of a cyclic amine compound, 10-80 weight % of a glycol ether compound, 5-30 weight % of distilled water, and 0.1-5 weight % of a corrosion inhibitor.

The chain amine compound of the composition will first be described according to an embodiment.

The chain amine compound according to one or more embodiments of the present invention is an organic amine that demonstrates a strong alkaline property. In addition, the chain amine compound highly tends to be infiltrated into a polymer matrix that is denatured under various processing conditions, such as dry or wet etching, ashing, ion implantation, or the like, cured or crosslinked by light. Since the chain amine compound is capable of breaking or weakening intramolecular or intermolecular bonds, a photoresist may be easily removed by the stripper containing the chain amine compound. That is to say, the chain amine compound basically serves as a stripper in the composition.

The amount of the chain amine compound according to one or more embodiments of the present invention is about 5-30 weight % based on the total amount of the composition. If the amount of the chain amine compound is less than about 5 weight %, the capability of dissolving the photoresist denatured or crosslinked during the process (including positive photoresist and negative photoresist) may be reduced. Thus, the photoresist cannot be completely removed. On the other hand, if the amount of the chain amine compound is greater than about 30 weight %, an organic or inorganic film or metal wires underlying the photoresist may be severely damaged. For example, the color filters made of organic materials, data wires, gate wires, pixel electrodes, etc. may be damaged. In particular, swelling of the color filters may deteriorate adhesion between the color filters and other films. In addition, cracks may also be created on the other films formed on the swollen color filters. Furthermore, voids may be formed in a liquid crystal layer to be formed on the color filter, and liquid crystal may not uniformly fill the liquid crystal layer, resulting in poor display quality.

The chain amine compound according to one or more embodiments of the present disclosure may be at least one selected from the group consisting of monoethanolamine, diethanolamine, triethanolamine, propanolamine, dipropanolamine, tripropanolamine, isopropanolamine, diisopropanolamine, triisopropanolamine, 2-(2-aminoethoxy)ethanol, 2-(2-aminoethoxy)ethanol, 2-(2-aminoethylamino) ethanol, N,N-dimethylethanol amine, N,N-diethylethanol amine, N-methylethanol amine, N-ethylethanol amine, N-butylethanol amine, and N-methyldiethanol amine.

Next, the cyclic amine compound contained in the composition for a photoresist stripper according to one or more embodiments of the present invention will be described.

The cyclic amine compound according to one or more embodiments of the present invention may prevent the color filters made of organic materials or the insulating films and metal wires made of inorganic materials from being damaged while maintaining the photoresist strippability. Therefore, damage to the color filters may be minimized, thereby preventing deterioration due to swelling of the color filters.

The amount of the cyclic amine compound according to one or more embodiments of the present invention is about 0.5-10 weight % based on the total amount of the composition. If the amount of the cyclic amine compound is less than about 0.5 weight %, it may be quite difficult to prevent the color filters made of organic materials or the insulating films and metal wires made of inorganic materials from being damaged. Accordingly, as described above, the swelling of the color filters cannot be prevented, resulting in poor display quality of the LCD. If the amount of the cyclic amine compound is greater than about 10 weight %, the photoresist strippability of the cyclic amine compound may be reduced, so that the photoresist cannot be completely stripped.

The cyclic amine compound according to one or more embodiments of the present disclosure may be at least one selected from the group consisting of 1-[(2-amino ethyl) amino]2-propanol, 1-(2-hydroxyethyl)piperazine, 1-(2-aminoethyl)piperazine, 1-(2-hydroxyethyl)-4-methylpiperazine, N-(3-aminopropyl)morpholine, 2-methylpiperazine, 1-methylpiperazine, 4-amino-1-methylpiperazine, 1-benzylpiperazine and 1-phenylpiperazine.

Next, the glycol ether compound contained in the composition for a photoresist stripper according to one or more embodiments of the present invention will be described.

The glycol ether compound according to one or more embodiments of the present invention is infiltrated into organic polymers of the photoresist to improve dissolving power, thereby improving washing power in a post-washing step. In addition, the glycol ether compound according to one or more embodiments of the present invention reduces surface tension between the photoresist and organic films or metal wires underlying the photoresist, thereby facilitating stripping of the photoresist. Furthermore, the glycol ether compound according to one or more embodiments of the present invention is capable of dissolving the stripped photoresist.

The amount of the glycol ether compound according to one or more embodiments of the present invention is about 10-80 weight % based on the total amount of the composition. If the amount of the glycol ether compound is less than about 10 weight %, the photoresist dissolving capability is not at a satisfactory level. Thus, it is not easy to strip the photoresist. If the amount of the glycol ether compound is greater than about 80 weight %, damages may be caused to the color filters, resulting in deterioration of display quality.

The glycol ether compound according to one or more embodiments of the present invention has a boiling point of 160° C. or higher. The glycol ether compound is at least one selected from the group consisting of ethylene glycol ethyl ether, ethylene glycol butyl ether, diethylene glycol methyl ether, diethylene glycol ethyl ether, diethylene glycol propyl ether, diethylene glycol butyl ether, triethylene glycol methyl ether, triethylene glycol ethyl ether, triethylene glycol butyl ether, triethylene glycol and tetraethylene glycol.

Next, distilled water contained in the composition for a photoresist stripper according to one or more embodiments of the present invention will be described.

As the distilled water according to one or more embodiments of the present invention, pure water filtered by an ion exchange resin may be used. Moreover, ultrapure water having specific resistance of 18 MΩ or greater may be used. The amount of the distilled water according to one or more embodiments of the present invention is about 5-30 weight % based on the total amount of the composition. If the amount of distilled water is less than about 5 weight %, damages may be caused to the color filters or insulating films. In addition, viscosity of the stripper composition may increase, thereby reducing infiltration efficiency of the stripper. If the amount of distilled water is greater than about 30 weight %, the stripper composition may become overly diluted, thereby reducing the strippability.

Finally, the corrosion inhibitor contained in the composition for a photoresist stripper according to one or more embodiments of the present invention will be described.

The corrosion inhibitor according to one or more embodiments of the present invention prevents corrosion of the color filters and metal wires contacting the stripper composition, which is allowed such that chemically or physically weak binding is formed between polar functional groups contained in the corrosion inhibitor and the organic materials of the color filters or metal wires. That is, if the corrosion inhibitor chemically or physically binds with the organic materials of the color filters or metal wires with weak binding intensity, electronic exchange between the stripper for removing the photoresist serving as an electrolyte and the organic materials of the color filters or metal wires is fundamentally prevented, so that the organic materials of the color filters or metal wires are not oxidized, thereby preventing corrosion.

The amount of the corrosion inhibitor according to one or more embodiments of the present invention is about 0.1-5 weight % based on the total amount of the composition. If the amount of the corrosion inhibitor is less than about 0.1 weight %, the photoresist stripper containing the amine compound cannot exert a corrosion preventing effect properly. If the amount of the corrosion inhibitor is greater than about 5 weight %, chemically or physically weak binding may be formed between the corrosion inhibitor and the photoresist as well as between the corrosion inhibitor and the organic materials of the color filters or metal wires, thereby further reducing the capability of the stripper for removing the photoresist.

The corrosion inhibitor according to one or more embodiments of the present disclosure may be at least one selected from the group consisting of glucose, sugar alcohol, an aromatic hydroxyl compound, acetylenic alcohol, a carboxylic acid compound and anhydrides thereof, and a triazole compound. Particularly, among the listed materials, the corrosion inhibitor may be at least one selected from the group consisting of sorbitol, xylitol, pyrocatechol, pyrogallol, gallic acid, 2-butien-1,4-diol, phthalic acid, phthalic anhydride, salicylic acid, ascorbic acid, tolyltriazole and benzotriazole.

The aforementioned composition for a photoresist stripper according to one or more embodiments of the present invention is prepared in a general manner, and may then be subjected to a photolithography process of a manufacture method of an LCD to be used in removing photoresist (including positive photoresist and negative photoresist). In particular, existing organic photoresist strippers may cause swelling of color filters, ultimately resulting in deterioration of display quality. In contrast, the water-based stripper according to the one or more embodiments of present invention does not render such problems. Furthermore, substantially the same strippability as the conventional stripper may be maintained in the composition according to one or more embodiments of the present invention without being deteriorated.

Hereinafter, embodiments of the present invention will be explained in more detail with reference to the following examples and comparative examples. However, these examples are given for the purpose of illustration and are not intended to limit the disclosure. Unless otherwise specified, the percentage and the mixture ratio represent weight percent and weight ratio.

Examples

Examples 1-10 and Comparative Examples 1-5

Compositions for a photoresist stripper according to one or more embodiments of the present invention were prepared by stirring components, the proportions of which are listed in Table 1, in a mixing tank equipped with an agitator at 200-600 rpm at room temperature for 0.3 to 3 hours.

TABLE 1

| Exp. No. | Cyclic amine compound Component | wt % | Chain amine compound Component | wt % | Glycol ether compound Component | wt % | Distilled water wt % | Corrosion inhibitor Component | wt % |
|---|---|---|---|---|---|---|---|---|---|
| Exp. 1 | HEP | 2 | MEA | 25 | BDG | 53 | 20 | BT | 1 |
| Exp. 2 | AEAP | 2 | MEA | 25 | BDG | 53 | 20 | BT | 1 |
| Exp. 3 | APM | 2 | MEA | 25 | BDG | 53 | 20 | BT | 1 |
| Exp. 4 | HEP | 8 | MEA | 15 | BDG | 57 | 20 | BT | 1 |
| Exp. 5 | AEAP | 8 | MEA | 15 | BDG | 57 | 20 | BT | 1 |
| Exp. 6 | HEP | 8 | MEA | 15 | BDG | 57 | 20 | BT | 0.5 |
| Exp. 7 | HEP | 2 | MIPA | 20 | BDG | 58 | 20 | BT | 1 |
| Exp. 8 | HEP | 2 | AEE | 20 | BDG | 58 | 20 | BT | 1 |
| Exp. 9 | HEP | 2 | AEE | 20 | BDG | 58 | 20 | PY | 1 |
| Exp. 10 | HEP | 2 | AEE | 20 | BDG | 58 | 20 | TT | 1 |
| Comp. Exp. 1 | — | — | MEA | 30 | NMP | 60 | 10 | — | — |
| Comp. Exp. 2 | — | — | AEE | 50 | BDG | 40 | 10 | — | — |
| Comp. Exp. 3 | — | — | MEA | 0.5 | BDG | 80 | 19.5 | — | — |

TABLE 1-continued

| Exp. No. | Cyclic amine compound Component | wt % | Chain amine compound Component | wt % | Glycol ether compound Component | wt % | Distilled water wt % | Corrosion inhibitor Component | wt % |
|---|---|---|---|---|---|---|---|---|---|
| Comp. Exp. 4 | — | — | MEA | 40 | BDG | 10 | 60 | — | — |
| Comp. Exp. 5 | HEP | 15 | MEA | 30 | NMP | 45 | 10 | — | — |

APM: N-(3-aminopropyl)morpholine
HEP: 1-(2-hydroxyethyl)piperazine
AEAP: 1-[(2-aminoethyl)amino]2-propanol
AEE: 2-(2-aminoethoxy)ethanol
MIPA: Monoisopropanolamine
MEA: Monoethanolamine
BDG: Diethylene glycol monobutyl ether
BT: Benzotriazole
PY: Pyrogallol
TT: Tolyltriazole Test Example Various performance tests of the compositions for a photoresist stripper according to one or more embodiments of the present invention prepared in the Examples and Comparative Examples were evaluated in the following manners.

Preparation of Test Piece 1

To evaluate the extent of damage to color filters and insulating films caused by the compositions prepared in the Examples and Comparative Examples, each of color filters and insulating films of approximately 2 µm was formed on a glass substrate using plasma vapor deposition (PVD) equipment. Thereafter, the formed color filter and insulating film were baked in an oven under the condition of approximately 200° C./hr.

Preparation of Test Piece 2

To evaluate the extent of damage to metal wires caused by the compositions for a photoresist stripper according to one or more embodiments of the present invention prepared in the Examples and Comparative Examples, aluminum (Al) and molybdenum (Mo) films of approximately 200 nm thickness were formed on a glass substrate using PVD equipment.

Preparation of Test Piece 3

To evaluate the extent of photoresist strippability of the compositions for a photoresist stripper according to one or more embodiments of the present invention prepared in the Examples and Comparative Examples, chrome (Cr) was applied on a glass substrate, and a general negative photoresist (SDN-03 produced by Dongjin Semichem, Korea) was formed thereon to a thickness of approximately 1.5 µm. Here, the negative photoresist was spin coated at 2500 rpm. Thereafter, the negative photoresist was soft baked at 90° C. for 90 seconds. Next, the negative photoresist was subjected to exposure and development, followed by hard baking at 130° C. for 150 seconds, thereby obtaining the captioned test piece.

Preparation of Test Piece 4

To form a denatured photoresist, the test piece prepared in the preparation of Test Piece 3 was dry etched. In this case, adhesion between Cr and photoresist is maximized. If a photoresist is supplied with a dry etch gas, deformation may be caused to the photoresist, deteriorating photoresist stripping efficiency. Thus, it is not easy to strip the photoresist using a stripper, and the thus-formed photoresist may be suitably used as a test piece for testing strippability of a photoresist.

Evaluation of Damage

To evaluate the extent of damage to color filters, insulating films and metal wires caused by the compositions for a photoresist stripper according to one or more embodiments of the present invention as prepared in Examples and Comparative Examples, test pieces 1 and 2 were dipped into each composition for 5 minutes. Next, the test pieces 1 and 2 were taken out from the composition, washed and dried. Thereafter, the resultant test pieces were observed by the naked eye and a microscope, and the results are presented in Table 2.

Evaluation of Stripping Capability

The stripping capabilities of the compositions for a photoresist stripper according to one or more embodiments of the present invention prepared in the Examples and Comparative Examples were evaluated. To this end, test pieces 3 and 4 were dipped in the prepared compositions for 30 seconds. Next, the test pieces 3 and 4 were taken out from the compositions, washed and dried. Thereafter, SEM (scanning electronic microscopy) was used to check whether each photoresist remained or not for evaluation of photoresist strippability. The results are presented in Table 2.

TABLE 2

| | Criteria for Evaluation | | | | | |
|---|---|---|---|---|---|---|
| | Damage to Color Filter Test Piece 1 | Damage to Insulating film | Damage to Metal Wire | | Photoresist Strippability | |
| | | | Al | Mo | Test Piece 3 | Test Piece 4 |
| | | | Test Piece 2 | | Dip at 70° C. for 30 seconds | |
| | Dip at 70° C. for 5 minutes | | | | | |
| Exp. 1 | ⊚ | ⊚ | ⊚ | ⊚ | ⊚ | ⊚ |
| Exp. 2 | ⊚ | ⊚ | ⊚ | ⊚ | ⊚ | ⊚ |
| Exp. 3 | ⊚ | ⊚ | ⊚ | ⊚ | ⊚ | ⊚ |
| Exp. 4 | ⊚ | ⊚ | ⊚ | ⊚ | ⊚ | ⊚ |

TABLE 2-continued

| | Criteria for Evaluation | | | | | |
|---|---|---|---|---|---|---|
| | Damage to Color Filter | Damage to Insulating film | Damage to Metal Wire | | Photoresist Strippability | |
| | | | Al | Mo | Test Piece 3 | Test Piece 4 |
| | Test Piece 1 | | Test Piece 2 | | Dip at 70° C. for 30 seconds | |
| | Dip at 70° C. for 5 minutes | | | | | |
| Exp. 5 | ⊚ | ⊚ | ⊚ | ⊚ | ⊚ | ⊚ |
| Exp. 6 | ⊚ | ⊚ | ⊚ | ⊚ | ⊚ | ⊚ |
| Exp. 7 | ⊚ | ⊚ | ⊚ | ⊚ | ⊚ | ⊚ |
| Exp. 8 | ⊚ | ⊚ | ⊚ | ⊚ | ⊚ | ⊚ |
| Exp. 9 | ⊚ | ⊚ | ⊚ | ⊚ | ⊚ | ⊚ |
| Exp. 10 | ⊚ | ⊚ | ⊚ | ⊚ | ⊚ | ⊚ |
| Comp. Exp. 1 | X | △ | X | X | ⊚ | ⊚ |
| Comp. Exp. 2 | X | △ | X | X | ⊚ | ⊚ |
| Comp. Exp. 3 | ⊚ | ⊚ | ⊚ | ⊚ | X | X |
| Comp. Exp. 4 | △ | △ | X | X | △ | X |
| Comp. Exp. 5 | △ | △ | X | X | ⊚ | ⊚ |

Damage to color filter and insulating film: ⊚ (No swelling), ○ (Slight swelling), △ (Significant swelling), X (Severe swelling)
Damage to metal wires: ⊚ (No corrosion), ○ (Slight corrosion), △ (Severe corrosion), X (Complete corrosion)
Photoresist strippability: ⊚ (Excellent), ○ (Fair), △ (Poor), X (None)

Referring to Table 2, the compositions prepared in the Examples according to one or more embodiments of the present invention exhibit no swelling, by which the extent of damage of the color filters and insulating films may be determined. In addition, the compositions prepared in the Examples according to one or more embodiments of the present invention demonstrated excellent stripping capabilities for a photoresist and a modified photoresist (e.g., Test Piece 4). If the compositions prepared in Comparative Examples had excellent photoresist strippability, damages to color filters or insulating film were severe. Conversely, slightly damaged color filters or insulating film showed poor photoresist strippability. Therefore, if an LCD is manufactured using the composition according to one or more embodiments of the present invention, swelling of the color filters or the insulating film may be prevented, so that an adhesion characteristic at an interface between the color filters or insulating film and another thin film may be improved, thereby uniformly adjusting the thickness of portions filled with liquid crystal. In addition, voids can be prevented from being formed at the portions filled with liquid crystal in a liquid crystal layer, thereby avoiding deterioration of display quality.

Next, a method of fabricating a TFT array substrate using the composition according to one or more embodiments of the present invention will be briefly described.

Figure 1B:
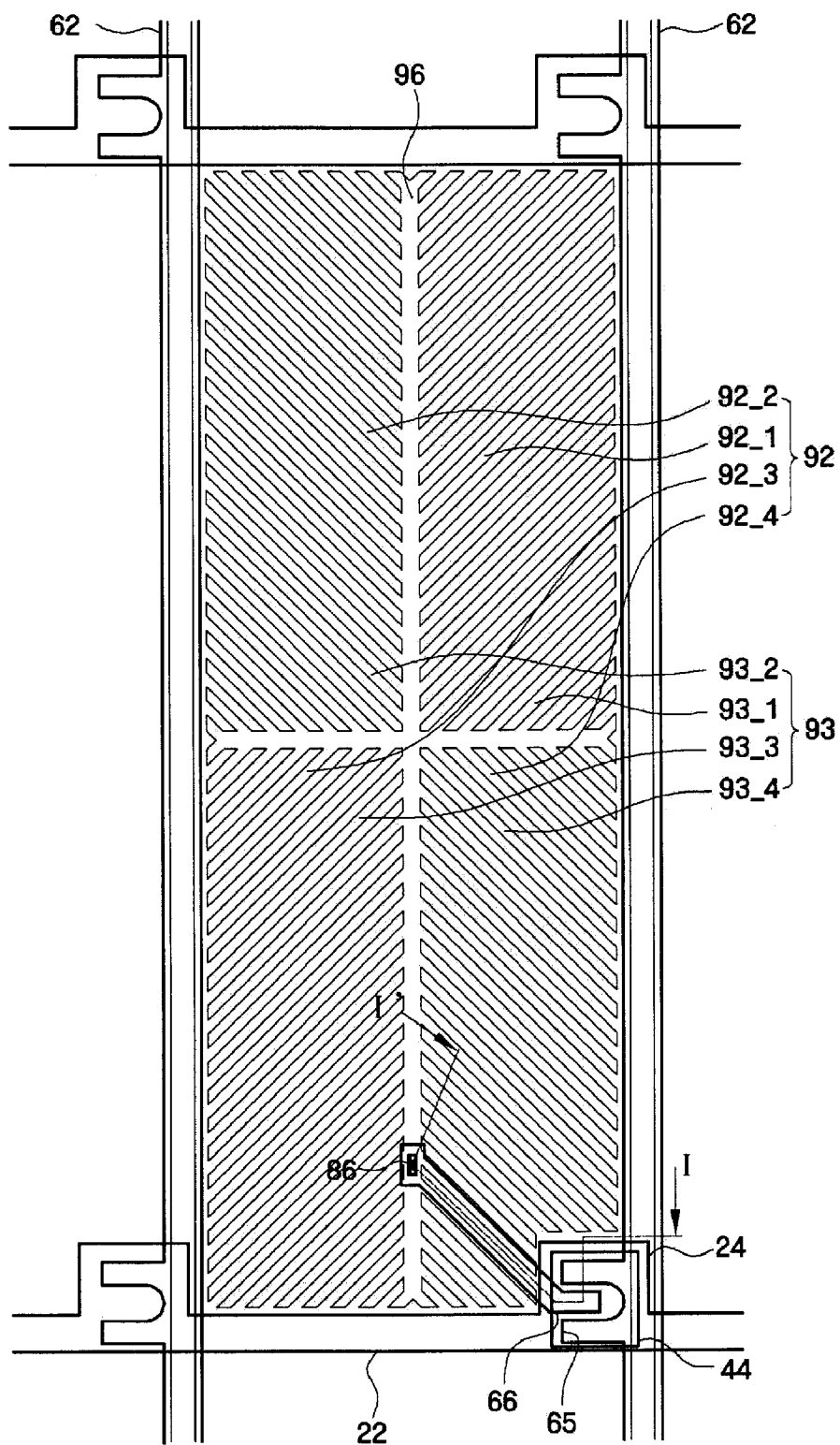
FIG. 1B is an enlarged layout view of a portion "A" shown in FIG. 1 according to an embodiment.
Figure 2:
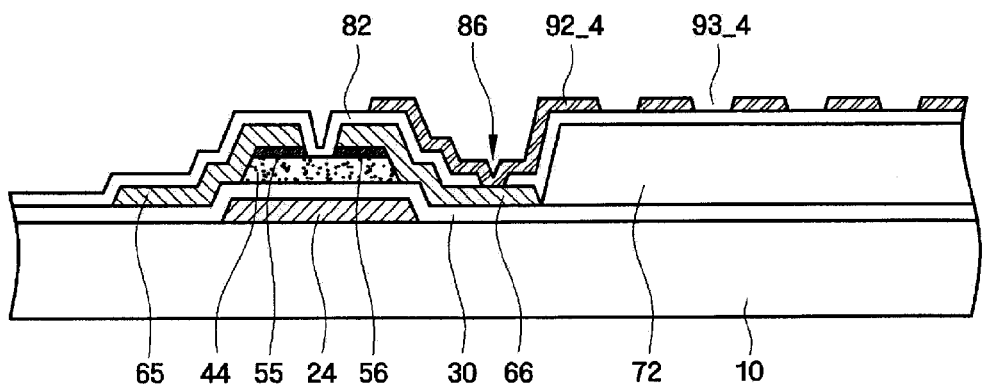
FIG. 2 is a sectional view of the TFT array substrate shown in FIG. 1B taken along line I-I' according to an embodiment.

FIG. 1A is a layout view of a TFT array substrate according to an exemplary embodiment of the present invention, FIG. 1B is an enlarged layout view of a portion "A" shown in FIG. 1 according to an embodiment, FIG. 2 is a sectional view of the TFT array substrate shown in FIG. 1B taken along line I-I', and FIGS. 3A through 3H are cross-sectional views that sequentially illustrate fabricating a TFT array substrate according to an exemplary embodiment of the present invention.

Referring to FIGS. 1A and 1B, a TFT array substrate according to an embodiment of the present invention includes multiple pixels arrayed in a matrix type and multiple thin film transistors (TFTs) for respective pixels. Multiple gate lines 22 extending along the boundary of pixels are arranged in a pixel row direction and multiple data lines 62 extending along the boundary of pixels are arranged in a pixel column direction. A thin film transistor (TFT) having a gate electrode 24, a source electrode 65 and a drain electrode 66 is formed at an intersection of each of the gate lines 22 and each of the data lines 62. A pixel electrode 92 is enclosed by the gate lines 22 and the data lines 62 and takes up most of a pixel area. The pixel electrode 92 is also connected to the drain electrode 66 of the TFT to apply a pixel voltage through the TFT. Referring to FIG. 1B, the pixel electrode 92 may be formed to have a plurality of domains. In addition, each of the plurality of domains multiple micro-electrodes 92_1, 92_2, 92_3, and 92_4 may be arranged in parallel in a predetermined direction. Here, the term "domain" means a region comprised of liquid crystal molecules, the directors of which are tilted in groups in a predetermined direction by an electric field formed between the pixel electrode 92 and a common electrode (not shown).

Each pixel includes an organic color film representing one of red (R), green (G) and blue (B) colors. As the colors illustrated in the embodiment of FIG. 1A are arranged in the pixel row, red, green and blue colors alternately appear. Here, pixels belonging to the same column may include organic films representing the same color.

The structure of the TFT array substrate will be described in detail with reference to FIGS. 1A through 2 according to one or more embodiments.

A base plate of the TFT array substrate may be, without limitation, an insulating substrate 10 made of, for example, glass, quartz or plastic.

The gate lines 22 made of a conductive material and the gate electrode 24 connected to the gate lines 22 are formed on the insulating substrate 10. Although not directly shown, a storage electrode line (not shown) may further be formed on the same layer as the gate lines 22 and the gate electrode 24 provided on the insulating substrate 10.

A gate insulating layer 30 is disposed over the gate lines 22 and the gate electrode 24. The gate insulating layer 30 may be a single layer made of, for example, silicon oxide ($SiO_x$), silicon nitride ($SiN_x$), a stacked layer thereof, or the like.

A semiconductor layer 44 that may be made of hydrogenated amorphous silicon and ohmic contact layers 55 and 56 that may be made of n+ hydrogenated amorphous silicon and heavily doped with an n-type impurity are disposed on the gate insulating layer 30. The semiconductor layer 44 and the ohmic contact layers 55 and 56 overlap with the gate electrode 24. The ohmic contact layers 55 and 56 are separated from each other in a channel region to expose the semiconductor layer 44 under the ohmic contact layers 55 and 56.

A data wire structure (62, 65, 66) made of a conductive material is formed on the ohmic contact layers 55 and 56. The data wire structure (62, 65, 66) includes a data line 62, a source electrode 65, and a drain electrode 66. The source electrode 65 is branched off from the data line 62 toward the gate electrode 24. A drain electrode 66, which is spaced apart from the source electrode 65, is opposite to the source electrode 65 relative to the gate electrode 24. The source electrode 65 and the drain electrode 66 have at least some portions overlapping with semiconductor layer 44 and the gate electrode 24. As described above, the gate electrode 24, the source electrode 65 and the drain electrode 66 constitute a thin film transistor. The gate electrode 24 and the semiconductor layer 44 disposed between the source electrode 65 and the drain electrode 66 form a TFT channel. The ohmic contact layers 55 and 56 disposed between the semiconductor layer 44 and the source electrode 65 and between the semiconductor layer 44 and the drain electrode 66 reduce contact resistance therebetween.

Red, green or blue color organic films 72 representing red (R) green (G) and blue (B) are formed in the pixel region of the insulating substrate 10. The color organic films 72 are connected to one another in a pixel column direction but are isolated from one another in a pixel row direction. That is, the color organic films 72 overlap with the gate lines 22 but do not overlap with the data wire structure (62, 65, 66). In addition, the color organic films 72 are isolated from one another in view of the data line 62. In the illustrated example of FIG. 1A, alternatively changing colors are represented by the isolated color organic films.

A passivation layer 82 is formed on the color organic films 72. The passivation layer 82 is formed on the data wire structure (62, 65, 66) as well as on the color organic films 72. The passivation layer 82 is made of, for example, silicon nitride. A contact hole 86 exposing at least a portion of the drain electrode 66 is formed in the passivation layer 82.

The pixel electrode 92 made of a transparent conductive material such as indium tin oxide (ITO) or indium zinc oxide (IZO) is formed on the passivation layer 82. The pixel electrode 92 is separated from each pixel and is electrically connected to the drain electrode 66 via the contact hole 86. The pixel electrode 92 includes a plurality of domains, and each of the plurality of domains includes a plurality of micro-electrodes 92_1, 92_2, 92_3, and 92_4 arranged in parallel with one another in a predetermined direction. Micro-slits 93_1, 93_2, 93_3 and 93_4 are formed between each of the plurality of micro-electrodes 92_1, 92_2, 92_3 and 92_4.

Although not directly shown, an alignment film (not shown) may further be provided on the pixel electrode 92.

The aforementioned TFT array substrate according to one or more embodiments may be used as a display panel of an LCD. That is, the TFT array substrate may be as a first display panel, and a substrate having a common electrode may be as a second display panel. The first and second display panels may be disposed opposite to each other and a liquid crystal display layer is interposed therebetween, thereby completing the LCD.

Next, a method of fabricating the TFT array substrate will be described with reference to FIGS. 3A through 3H, which are cross-sectional views that sequentially illustrate a fabricating method of the TFT array substrate according to one or more exemplary embodiments of the present invention.

Figure 3A:
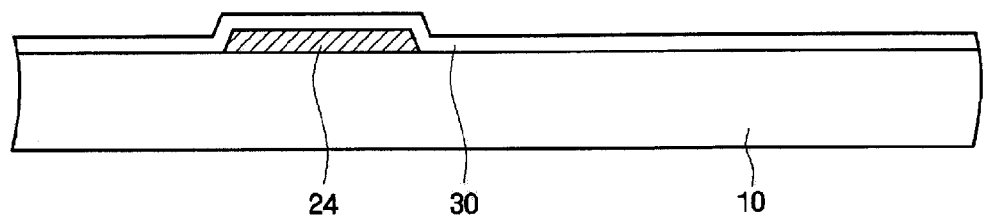
FIGS. 3A through 3H are sectional views that sequentially illustrate fabricating a TFT array substrate according to an exemplary embodiment of the present invention.

Referring to FIG. 3A, a conductive material is stacked on the insulating substrate 10 made of a transparent material such as glass, quartz or plastic and patterned to form the gate lines 22 and the gate electrode 24. In the case of forming the storage electrode line (not shown), it may be formed in this stage. Next, silicon nitride is stacked on the entire surface of the insulating substrate 10 having the gate lines 22 and the gate electrode 24 to form the gate insulating film 30. The forming of the gate insulating film 30 may be performed by, for example, CVD (Chemical Vapor Deposition), PECVD (Plasma Enhanced Chemical Vapor Deposition), or the like.

Figure 3B:
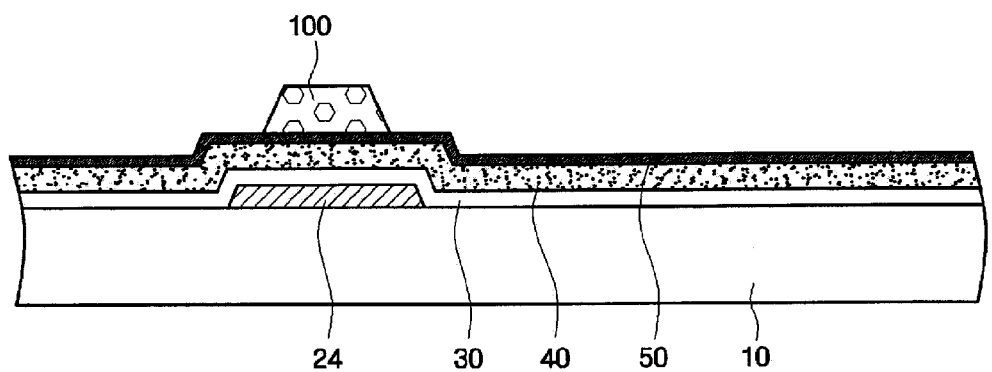

Referring to FIG. 3B, a hydrogenated amorphous silicon layer 40 and an n+ hydrogenated amorphous silicon layer 50 heavily doped with an n-type impurity are sequentially formed on the gate insulating layer 30. Subsequently, in order to form an ohmic contact layer 54 and a semiconductor layer 44 by patterning the n+ hydrogenated amorphous silicon layer 50 and the hydrogenated amorphous silicon layer 40, a photoresist pattern 100 is formed on a portion on the amorphous silicon layer 50 overlapping with the gate electrode 24. The photoresist pattern 100 on the amorphous silicon layer 50 may be formed using a positive photoresist used to remove an exposed portion. Alternatively, the photoresist pattern 100 may be formed using a negative photoresist used to remove a non-exposed portion. The photoresist pattern 100 is formed such that a photoresist film is first formed on the entire surface of the amorphous silicon layer 50 and the photoresist film is then selectively exposed using an optical mask.

Here, the optical mask used in the case where the photoresist film is made of a positive photoresist may be a mask capable of transmitting light of a portion corresponding to the photoresist film to be removed and blocking light of the other portion. The photoresist film that is selectively exposed by the optical mask is changed in its photochemical structure, and developed, yielding the photoresist pattern 100 as desired.

Figure 3C:
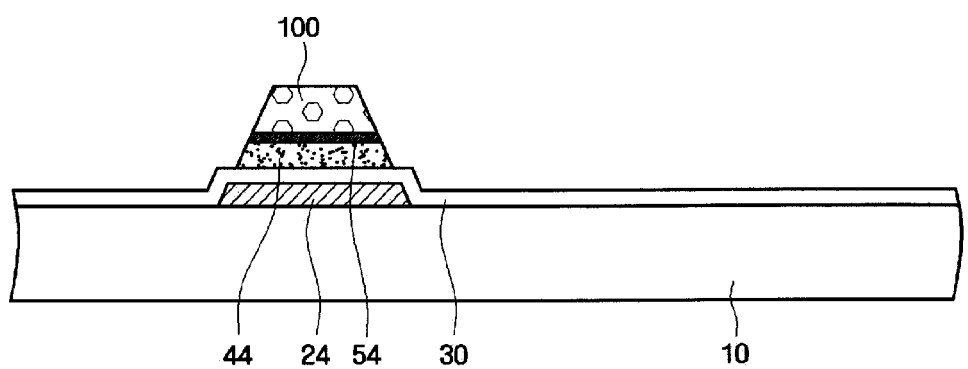

Referring to FIG. 3C, the n+ hydrogenated amorphous silicon layer 50 and the hydrogenated amorphous silicon layer 40 are patterned using the photoresist pattern 100 as an etch mask to form the ohmic contact layer 54 and the semiconductor layer 44. Here, the ohmic contact layer 54 is not yet separated from the semiconductor layer 44, but is formed in substantially the same pattern with the underlying semiconductor layer 44.

Next, the photoresist pattern 100 is stripped from the ohmic contact layer 54 using the stripper composition according to one or more embodiments of the present invention. For example, the stripping of the photoresist pattern 100 may be performed by dipping the substrate 10 having the photoresist pattern 100 in a stripper. Alternatively, the stripping of the photoresist pattern 100 may be performed by spraying a stripper onto the photoresist pattern 100.

Figure 3D:
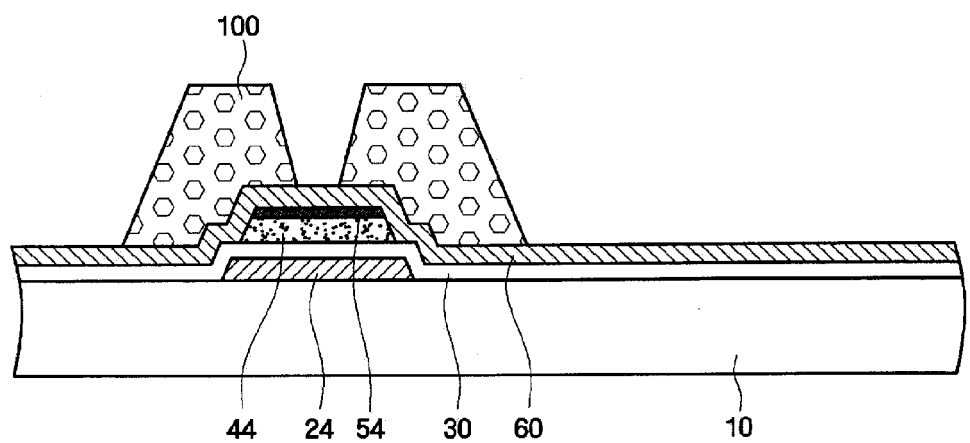

Referring to FIG. 3D, a data conductive layer 60 made of a conductive material is formed on the resultant structure shown in FIG. 3C. Next, the photoresist pattern 100 defining data wires is formed on the data conductive layer 60. Since methods of forming the photoresist and the photoresist pattern 100 may be substantially the same as described in FIG. 3C according to an embodiment, the repetitive description will not be made.

Figure 3E:
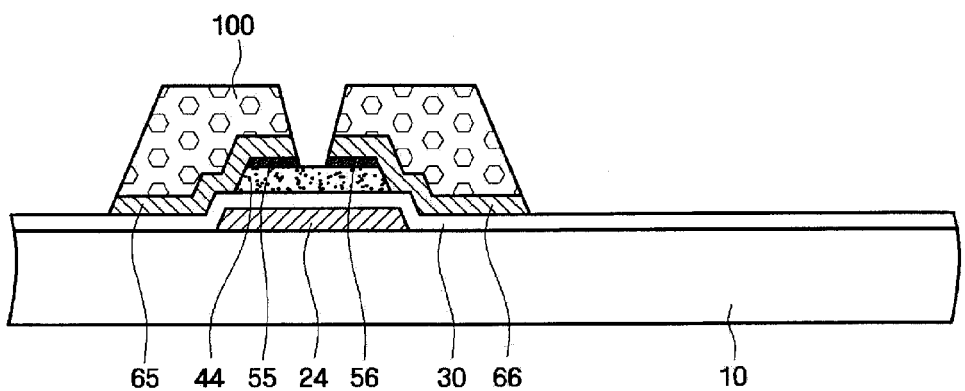

Referring to FIG. 3E, the data conductive layer 60 is etched using the photoresist pattern 100 as an etch mask, thereby completing the data wires having the data line 62, the source electrode 65 and the drain electrode 66. Here, as the source electrode 65 and the drain electrode 66 are patterned, the underlying ohmic contact layer 54 is partially exposed. Next, the exposed ohmic contact layers 55 and 56 are etched using the photoresist pattern 100 and/or the data wire structure (62, 65, 66) as etch masks.

Thereafter, the photoresist pattern 100 is stripped from the data line 62, the source electrode 65 and the drain electrode 66. Since a method of stripping the photoresist pattern 100 is substantially the same as described in FIG. 3C according to an embodiment, the repetitive description will not be made.

Figure 3F:
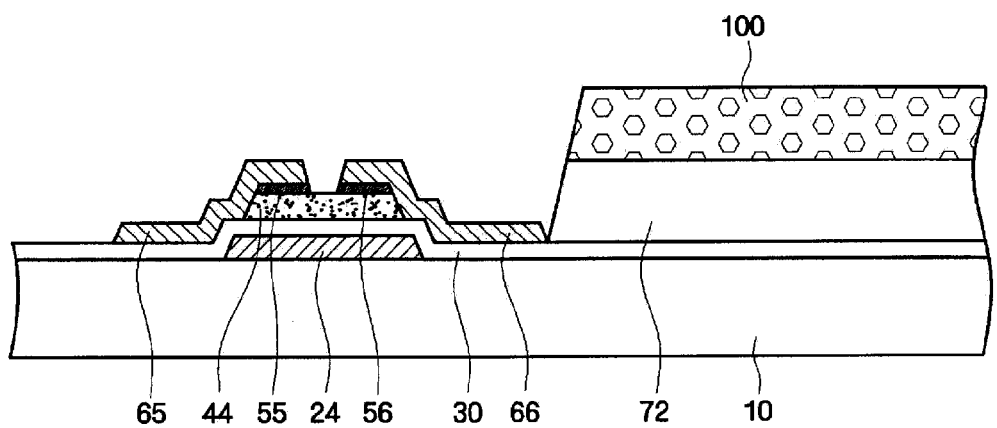

Referring to FIG. 3F, the color filter 72 is formed on the resultant structure shown in FIG. 3E. According to one or more embodiments, the color filter 72 may be formed using a method of fabricating a dye-type color filter or a method of fabricating a pigment-type color filter. The former method includes a dyeing process, a dye dispersing process, and so on. The latter method includes a pigment dispersing process, a printing process, an adhesion processing, and so on. A color organic material for forming the color filter 72 is applied to the substrate 10 using one of the listed methods, dried and cured. The drying and curing methods may be exemplified by heat treatment or ultraviolet (UV) irradiation. The drying and curing methods provide the color filter 72 in a pixel region. The color filter 72 in the pixel region may be formed as red, green or blue color organic films.

Figure 3G:
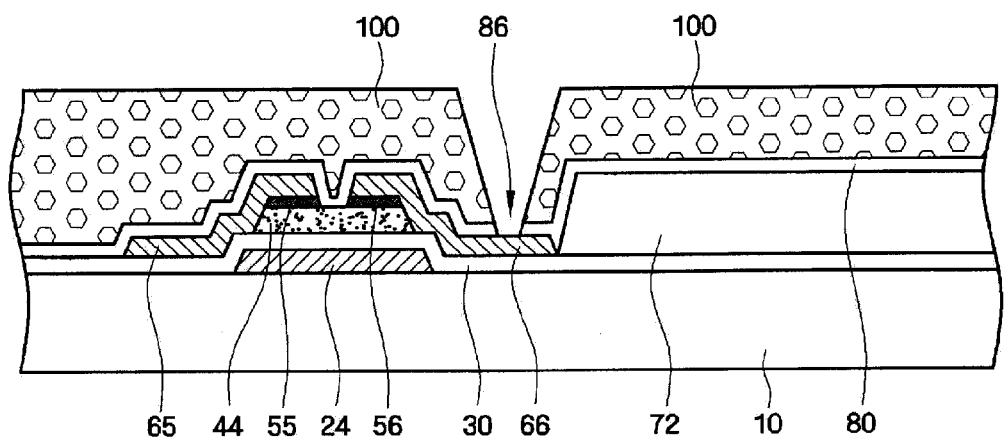

Referring to FIG. 3G, the passivation layer 82 made of silicon nitride is formed on the entire surface of the resultant structure shown in FIG. 3F. Next, the contact hole 86 exposing at least a portion of the drain electrode 66 is formed. To this end, the photoresist pattern 100 is formed on the passivation layer 82. After forming the contact hole 86, the photoresist pattern 100 on the passivation layer 82 is stripped.

Figure 3H:
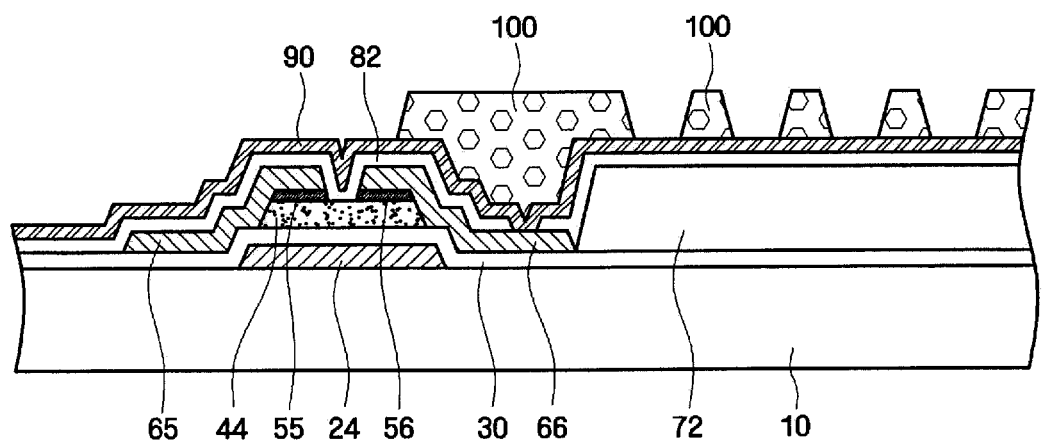

Referring to FIG. 3H, a transparent conductive material such as ITO or IZO is stacked on the resultant structure shown in FIG. 3G and patterned to form the pixel electrode 92 electrically connected to the drain electrode 66 through the contact hole 86. Thereafter, in order to improve the driving power of liquid crystal, the pixel electrode 92 may be divided into micro-electrodes 92_1, 92_2, 92_3 and 92_4. To this end, the photoresist pattern 100 is formed on the pixel electrode 92, which is then patterned. Here, a portion of the pixel electrode 92 where the photoresist pattern 100 is formed becomes micro-electrodes 92_1, 92_2, 92_3 and 92_4, and the other portion of the pixel electrode 92 becomes micro-slits 93_1, 93_2, 93_3 and 93_4. Meanwhile, the photoresist pattern 100 used in patterning the pixel electrode 92 to form the micro-electrodes 92_1, 92_2, 92_3 and 92_4 may be a negative photoresist. When the negative photoresist is exposed to light, it tends to be cured. On the other hand, a positive photoresist may be used instead of the negative photoresist in forming micro-patterns. In order to form micro-patterns, it is necessary to arrange photoresist patterns on a target in a fine pitch. In a case of using the positive photoresist to form micro-patterns, a relatively weak curing tendency of the positive photoresist may cause photoresist patterns arranged in a fine pitch to stick to each other, resulting in micro-patterning inferiority. Accordingly, in order to avoid the micro-patterning inferiority in forming the micro-electrodes 92_1, 92_2, 92_3 and 92_4, a negative photoresist having a relatively high curing tendency may be used.

Referring back to FIG. 2, the photoresist pattern 100 is stripped from the resultant structure shown in FIG. 3H, thereby completing the fabrication of the TFT array substrate. Here, the photoresist pattern 100 may be stripped using the photoresist stripper according to one or more embodiments of the present invention. In particular, if the photoresist pattern 100 is made of a negative photoresist in FIG. 3H, the photoresist pattern 100 may be stripped using the composition according to one or more embodiments of the present invention, which exhibits excellent strippability for a negative photoresist. The photoresist stripper according to one or more embodiments of the present invention may minimize damage to color filters, an insulating film and metal wires, which may be caused during a photoresist stripping process. Thus, a TFT array substrate having excellent quality may be fabricated using the composition according to one or more embodiments of the present invention, ultimately achieving an LCD having improved display quality.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the disclosure.

What is claimed is:

1. A composition for a photoresist stripper comprising:
   about 5-30 weight % of a chain amine compound;
   about 0.5-10 weight % of a cyclic amine compound;
   about 10-80 weight % of a glycol ether compound;
   about 5-30 weight % of distilled water; and
   about 0.1-5 weight % of a corrosion inhibitor.

2. The composition for a photoresist stripper according to claim 1, wherein the chain amine compound is at least one selected from the group consisting of monoethanolamine, diethanolamine, triethanolamine, propanolamine, dipropanolamine, tripropanolamine, isopropanolamine, diisopropanolamine, triisopropanolamine, 2-(2-aminoethoxy)ethanol, 2-(2-aminoethoxy)ethanol, 2-(2-aminoethylamino) ethanol, N,N-dimethylethanol amine, N,N-diethylethanol amine, N-methylethanol amine, N-ethylethanol amine, N-butylethanol amine, and N-methyldiethanol amine.

3. The composition for a photoresist stripper according to claim 1, wherein the cyclic amine compound is at least one selected from the group consisting of 1-[(2-amino ethyl) amino]2-propanol, 1-(2-hydroxyethyl)piperazine, 1-(2-aminoethyl)piperazine, 1-(2-hydroxyethyl)-4-methylpiperazine, N-(3-aminopropyl)morpholine, 2-methylpiperazine, 1-methylpiperazine, 4-amino-1-methylpiperazine, 1-benzylpiperazine and 1-phenylpiperazine.

4. The composition for a photoresist stripper according to claim 1, wherein the glycol ether compound has a boiling point of 160° C. or higher.

5. The composition for a photoresist stripper according to claim 4, wherein the glycol ether compound is at least one selected from the group consisting of ethylene glycol ethyl ether, ethylene glycol butyl ether, diethylene glycol methyl ether, diethylene glycol ethyl ether, diethylene glycol propyl ether, diethylene glycol butyl ether, triethylene glycol methyl ether, triethylene glycol ethyl ether, triethylene glycol butyl ether, triethylene glycol and tetraethylene glycol.

6. The composition for a photoresist stripper according to claim 1, wherein the corrosion inhibitor is at least one selected from the group consisting of glucose, sugar alcohol, an aromatic hydroxyl compound, acetylenic alcohol, a carboxylic acid compound and anhydrides thereof, and a triazole compound.

7. The composition for a photoresist stripper according to claim 6, wherein the corrosion inhibitor is at least one selected from the group consisting of sorbitol, xylitol, pyrocatechol, pyrogallol, gallic acid, 2-butien-1,4-diol, phthalic acid, phthalic anhydride, salicylic acid, ascorbic acid, tolyltriazole and benzotriazole.

* * * * *